US011412623B2

(12) United States Patent
Zhang

(10) Patent No.: US 11,412,623 B2
(45) Date of Patent: Aug. 9, 2022

(54) DISPLAY SCREENS, DISPLAY DEVICES INTEGRATED WITH THE SAME, AND COVER PLATES

(71) Applicant: Kunshan Go-Visionox Opto-Electronics Co., Ltd., Kunshan (CN)

(72) Inventor: Chunlei Zhang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 433 days.

(21) Appl. No.: 16/571,203

(22) Filed: Sep. 16, 2019

(65) Prior Publication Data
US 2020/0015367 A1 Jan. 9, 2020

Related U.S. Application Data

(63) Continuation of application No. PCT/CN2018/088898, filed on May 29, 2018.

(30) Foreign Application Priority Data

Oct. 31, 2017 (CN) .................. 201711051602.X

(51) Int. Cl.
*H05K 5/00* (2006.01)
*G02B 5/02* (2006.01)
*H05K 5/03* (2006.01)

(52) U.S. Cl.
CPC ......... *H05K 5/0017* (2013.01); *G02B 5/0242* (2013.01); *G02B 5/0278* (2013.01); *H05K 5/03* (2013.01)

(58) Field of Classification Search
CPC .. G02B 5/0242; G02B 5/0278; G02B 6/0043; G02B 6/0051; G02F 1/133606;
(Continued)

(56) References Cited

U.S. PATENT DOCUMENTS 8,807,768 B2    8/2014  Byeon et al.
9,377,174 B2    6/2016  Watanabe
(Continued)

FOREIGN PATENT DOCUMENTS

CN    102388333 A       3/2012
CN    102495454 A   *   6/2012
(Continued)

OTHER PUBLICATIONS

TW Office Action dated Oct. 17, 2019 in the corresponding TW application (application No. 107122428).
(Continued)

*Primary Examiner* — Erin Kryukova
(74) *Attorney, Agent, or Firm* — Kilpatrick Townsend & Stockton

(57) ABSTRACT

The present application relates to a display screen. The display screen includes: a screen main body having a main display region and a chamfered region adjacent to the main display region, and a cover plate sealing the screen main body. The cover plate includes a first light transmission region corresponding to the main display region and a second light transmission region corresponding to the chamfered region, and a light transmittance of the second light transmission region is lower than a light transmittance of the first light transmission region.

14 Claims, 3 Drawing Sheets

(58) Field of Classification Search
CPC ......... G02F 1/133504; G02F 1/133512; G02F 1/133331; F21V 3/049; G09F 2013/1854; G09F 2013/1859; H05K 5/03; H05K 5/0017

See application file for complete search history.

(56) References Cited

U.S. PATENT DOCUMENTS

| | | |
|---|---|---|
| 9,612,492 B2 | 4/2017 | Yang et al. |
| 2013/0034713 A1 | 2/2013 | Busman et al. |
| 2013/0163154 A1* | 6/2013 | Xie ................... G02F 1/13338 361/679.01 |
| 2016/0143094 A1 | 5/2016 | Kang |
| 2017/0053582 A1 | 2/2017 | Hsu |
| 2018/0012566 A1 | 1/2018 | Lin et al. |
| 2018/0337217 A1 | 11/2018 | Zang et al. |
| 2019/0235307 A1 | 8/2019 | Wang et al. |

FOREIGN PATENT DOCUMENTS

| | | | |
|---|---|---|---|
| CN | 102495454 A | | 6/2012 |
| CN | 103197744 A | | 7/2013 |
| CN | 104267529 A | | 1/2015 |
| CN | 104428828 A | | 3/2015 |
| CN | 104465707 A | | 3/2015 |
| CN | 105118383 A | * | 12/2015 |
| CN | 105118383 A | | 12/2015 |
| CN | 105511152 A | | 4/2016 |
| CN | 105788470 A | | 7/2016 |
| CN | 105988617 A | * | 10/2016 |
| CN | 105988617 A | | 10/2016 |
| CN | 106469533 A | | 3/2017 |
| CN | 106873224 A | | 6/2017 |
| CN | 106941132 A | | 7/2017 |
| CN | 107103893 A | | 8/2017 |
| CN | 206451144 U | | 8/2017 |
| CN | 107145035 A | | 9/2017 |
| CN | 107255883 A | | 10/2017 |
| CN | 107705703 A | | 2/2018 |
| KR | 20170018185 A | * | 2/2017 |
| TW | 201207487 A | | 2/2012 |
| WO | 2018176603 A1 | | 5/2017 |
| WO | 2018196081 A1 | | 11/2018 |
| WO | 2019085450 A1 | | 5/2019 |

OTHER PUBLICATIONS

International Search Report dated Sep. 5, 2018 in the corresponding International application (application No. PCT/CN2018/088898).
CN First Office Action with search report dated Jan. 30, 2019 in the corresponding CN application (application No. 201711051602.X).
TW Office Action with search report dated Apr. 26, 2019 in the corresponding TW application (application No. 107122428).
CN Second Office Action with supplemental search report dated Jun. 20, 2019 in the corresponding CN application (application No. 201711051602.X).

* cited by examiner

DISPLAY SCREENS, DISPLAY DEVICES INTEGRATED WITH THE SAME, AND COVER PLATES

CROSS REFERENCE TO RELATED APPLICATIONS

This application is a continuation application for International Application PCT/CN2018/088898, filed on May 29, 2018, which claims priority of the Chinese Patent application No. 201711051602.X, filed in CNIPA on Oct. 31, 2017, titled "DISPLAY SCREEN, DISPLAY DEVICE INTEGRATED WITH THE SAME AND COVER PLATE". The entireties of both applications are incorporated by reference herein for all purposes.

TECHNICAL FIELD

The present application relates to the field of display technologies.

BACKGROUND

With a development of electronic technology, electronic display screens have become more and more diverse, and special-shaped display screens such as rounded corner display screens and curved screens are appeared.

SUMMARY

According to various exemplary embodiments disclosed herein, a display screen is provided, including: a screen main body having a main display region and a chamfered region adjacent to the main display region; and a cover plate sealing the screen main body. The cover plate includes a first light transmission region corresponding to the main display region and a second light transmission region corresponding to the chamfered region, and a light transmittance of the second light transmission region is lower than a light transmittance of the first light transmission region.

In one of the exemplary embodiments, a thickness of the second light transmission region is greater than a thickness of the first light transmission region.

In one of the exemplary embodiments, a light transmittance of a material of the second light transmission region is lower than a light transmittance of a material of the first light transmission region.

In one of the exemplary embodiments, the cover plate is doped with scattering particles, and a doping concentration of scattering particles in the material of the second light transmission region is higher than a doping concentration of scattering particles in the material of the first light transmission region.

In one of the exemplary embodiments, the light transmittance of the second light transmission region gradually decreases away from the first light transmission region.

In one of the exemplary embodiments, the second light transmission region includes at least a first sub-region close to the main display region and a second sub-region separated from the main display region. A light transmittance of the second sub-region is lower than a light transmittance of the first sub-region.

In one of the exemplary embodiments, a thickness of the second sub-region is greater than a thickness of the first sub-region.

In one of the exemplary embodiments, a light transmittance of a material of the second sub-region of the cover plate is lower than a light transmittance of a material of the first sub-region.

In one of the exemplary embodiments, the second light transmission region is doped with scattering particles, and a doping concentration of scattering particles in the material of the second sub-region is higher than a doping concentration of scattering particles in the material of the first sub-region.

In one of the exemplary embodiments, widths of the first sub-region and the second sub-region decrease from a center thereof toward two ends thereof.

In one of the exemplary embodiments, a manner of gradually decreasing is a stepped hash variation.

In one of the exemplary embodiments, a manner of gradually decreasing is a linear variation.

In one of the exemplary embodiments, a thickness of the first light transmission region is ¼ of a green light wavelength.

The present application also provides a display device integrated with a display screen, the display screen including: a screen main body having a main display region and a chamfered region positioned adjacent to the main display region; and a cover plate sealing the screen main body. The cover plate has a first light transmission region corresponding to the main display region and a second light transmission region corresponding to the chamfered region, and a light transmittance of the second light transmission region is lower than a light transmittance of the first light transmission region.

The present application also provides a cover plate for sealing a screen main body. The screen main body has a main display region and a chamfered region adjacent to the main display region. The cover plate has a first light transmission region corresponding to the main display region and a second light transmission region corresponding to the chamfer region, and a light transmittance of the second light transmission region is lower than a light transmittance of the first light transmission region.

In the exemplary embodiments of the present application, at least the following beneficial effects are obtained.

The light transmittance of the second light transmission region is lower than the light transmittance of the first light transmission region, and a jaggy feeling of pixels or sub-pixels arranged along the contour line when displaying is weakened due to a decrease in brightness and contrast of the light caused by energy attenuation during propagation.

DETAILED DESCRIPTION OF THE INVENTION

In order to make the above objects, features and advantages of the present application more apparent, specific exemplary embodiments of the present application will be described in detail below with reference to the accompanying drawings. Numerous specific details are set forth in the description below in order to provide a thorough understanding of the application. However, the present application can be implemented in many other ways other than those described herein, and those skilled in the art can make similar modifications without departing from the scope of the present application, and thus the present application is not limited by the specific exemplary embodiments disclosed below.

Figure 1:
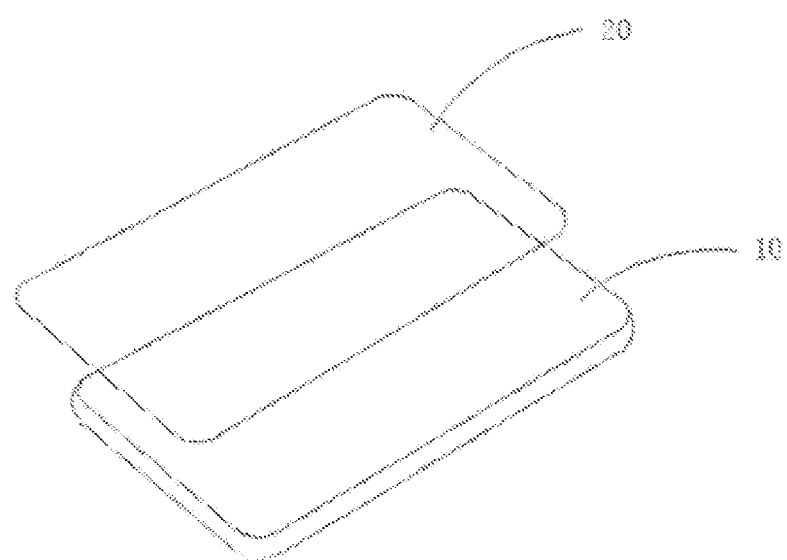
FIG. 1 is a schematic view of a display screen.

As shown in FIG. 1, an OLED display screen has an effective display region defined by a contour line. Corresponding pixels or sub-pixels are arranged along the contour line to fit a shape of the contour line. When there is a non-linear portion in the contour line, an arrangement of the pixels or sub-pixels arranged along the contour line is generally in a stepped shape or a jagged shape at the portion of the non-linear contour line. For example, when the display screen is chamfered as needed, the arrangement of the pixels or sub-pixels arranged along the chamfer is generally in the stepped shape or the jagged shape.

Referring to FIG. 1, the present application provides a display screen including a screen main body 10 and a cover plate 20 of the display screen.

Figure 2:
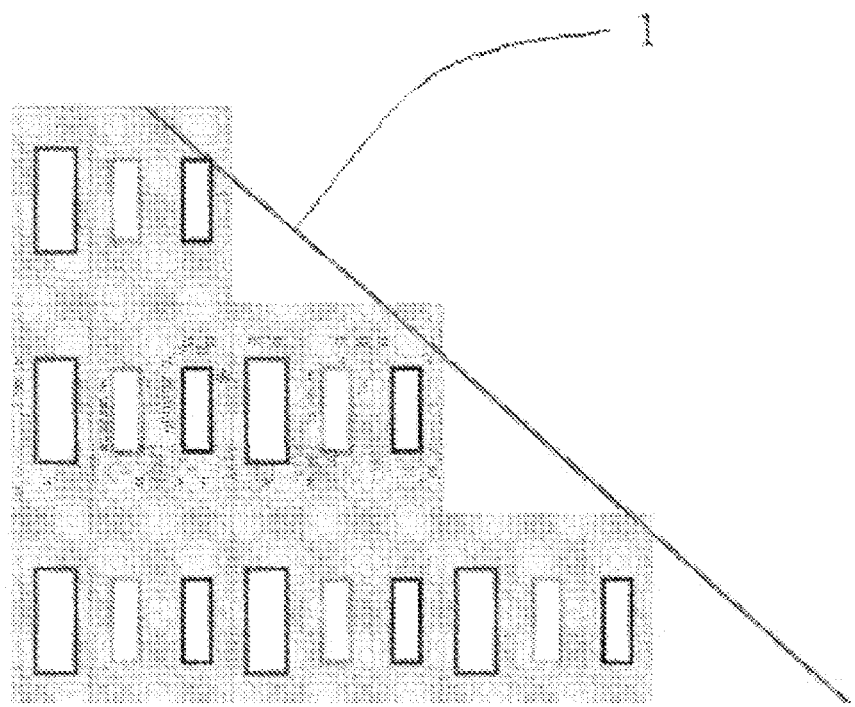
FIG. 2 is a schematic view showing a microstructure of a chamfered region of the display screen.

The screen main body 10 has a main display region and a chamfered region adjacent to the main display region. A microstructure of the chamfered region is shown in FIG. 2. Typically, the screen main body 10 has an effective display region defined by the contour line 1. The effective display region includes the main display region and the chamfered region adjacent to the main display region, which is generally located at a corner of the main display region, and is designed based on the user's needs.

Figure 3:
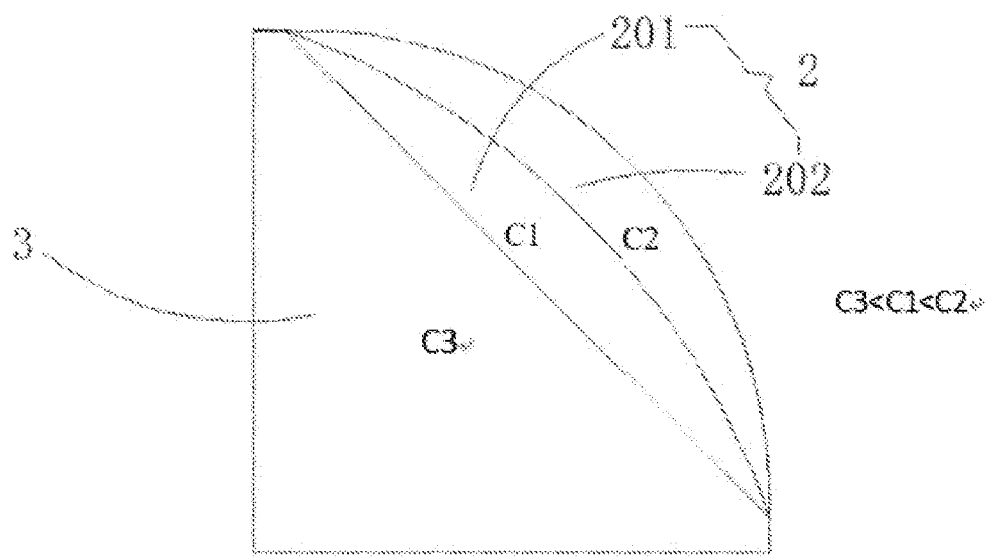
FIG. 3 is a schematic view of a cover plate of the display screen.

The cover plate 20 is used for sealing and protecting the screen main body 10. With continued reference to FIG. 3, the cover plate 20 has a first light transmission region 3 corresponding to the main display region and a second light transmission region 2 corresponding to the chamfered region. A light transmittance of the second light transmission region 2 is lower than a light transmittance of the first light transmission region 3. There are various methods for realizing that the light transmittance of the second light transmission region 2 is lower than that of the first light transmission region 3.

In an exemplary embodiment of the present application, a thickness of the second light transmission region 2 is greater than a thickness of the first light transmission region 3. The thickness of the second light transmission region 2 is relatively larger, and energy is gradually attenuated during light propagation, so that a jaggy feeling due to the stepped shape or jagged shape generally shown by the pixels or sub-pixels arranged along the contour line is weakened.

In a particular implementation process, thicknesses of different regions of the cover plate 20 can be selected differently depending on energy attenuation requirements of the light. For example, when the thickness of the first light transmission region 3 is X, the thickness of the second light transmission region 2 may be 1.2× to 1.5×. When light of the same light intensity propagates through an inside of the cover plate 20 to reach a surface of the cover plate 20, the light intensity or brightness of the second transparent region 2 is 60 to 80 percent of the light intensity or brightness of the first light transmission region 3. Specifically, when the thickness of the first light transmission region 3 is 0.1 mm, the thickness of the second light transmission region 2 may be 0.12 mm to 0.15 mm. In this way, the jagged feeling at an edge of the display region can be weakened.

It can be understood that a variation of the thickness of the cover plate 20 from the first light transmission region 3 toward the second light transmission region 2 herein is a stepped hash variation. Of course, the variation of the thickness of the cover plate 20 from the first light transmission region 3 toward the second light transmission region 2 can be set as a linear variation. For example, the thickness of the first light transmission region 3 of the cover plate 20 is 0.1 mm, and the thickness of an end of the second light transmission region 2 away from the first light transmission region 3 is 0.15 mm. The thickness of the cover plate 20 varies linearly from 0.1 mm at a boundary of the second light transmission region 2 and the first light transmission region 3 to 0.15 mm, and the further away from the boundary, the greater the thickness of the cover plate 20 is.

In an exemplary embodiment of the present application, a light transmittance of a material of the second light transmission region 2 is lower than a light transmittance of a material of the first light transmission region 3. The light transmittance of the second light transmission region 2 is relatively lower, therefore, the jaggy feeling due to the stepped shape or jagged shape generally shown by the pixels or sub-pixels arranged along the contour line 1 is weakened.

In a particular implementation, materials of different regions of the cover plate 20 can be selected differently depending on the energy attenuation requirements of the light. For example, polymethyl methacrylate (i.e., organic glass) may be selected as the material of first light transmission region 3. A material having a light transmittance lower than that of polymethyl methacrylate, for example, polycarbonate or the like, may be selected as the material of the second transmission region 2. Thereby, the jaggy feeling at the edge of display region can be weakened.

When the materials of different regions of the cover plate 20 are selected to be different according to the energy attenuation requirements of the light, the material can also be doped with scattering particles. For example, more doped particles are doped in the second light transmission region 2 than in the first light transmission region 3. Thus, when the light reaches the surface of the cover plate 20 through the entire thickness direction of the cover plate 20, the light intensity or brightness of the light is attenuated more in the second light transmission region 2. In this way, the jaggy feeling at the edge display region can be weakened.

It can be understood that a variation of the light transmittance of the material of the cover plate 20 from the first light transmission region 3 toward the second light transmission region 2 is a stepped hash variation. Of course, the variation of the transmittance of the material of the cover plate 20 from the first light transmission region 3 toward the second light transmission region 2 can also be a linear variation.

It can be understood that afore-mentioned the second light transmission region 2 and the first light transmission region 3 have different ranges of light intensity or light brightness. In order to further moderate the variation of the two regions, the light transmittance of the second light transmission region 2 gradually decreases in a direction away from the first light transmission region 3 in another exemplary embodiment of the present application.

In still another exemplary embodiment of the present application, the second transmission region 2 includes at least a first sub-region 201 adjacent to the main display region and a second sub-region 202 away from the main display region.

A thickness of the second sub-region 202 is greater than a thickness of the first sub-region 201.

From the afore-mentioned principle that the light intensity is attenuated according to an increase in the thickness of the cover plate 20, it can be understood that the light intensity or brightness of the outer surface of the cover plate 20 can be changed by changing the thickness of different regions of the cover plate 20. For example, the thickness of the second sub-region 202 of the second light transmission region 2 can be set to be twice of the thickness of the first light transmission region 3, and the thickness of the first sub-region 201 of the second light transmission region 2 can be set to be 1.5 times of the thickness of the cover plate 20 of the first light transmission region 3. That is, when the thickness of the first light transmitting region 3 of the cover plate 20 is set as 0.1 mm, the thickness of the first sub-region 201 of the second light transmission region 2 is set as 0.15 mm, and the thickness of the second sub-region 202 of the second light transmission region 2 is set as 0.2 mm. In this way, the light brightness of the first sub-region 201 of the second light transmission region 2 of the cover plate 20 is 60 to 70 percent of the light brightness of the first light transmission region 3, and the light brightness of the second sub-region 202 is 40 to 50 percent of the light brightness of the first light transmission region 3. Thicknesses of different light transmission regions are different, so that the attenuation of the energy of different regions of the cover plate 20 during propagation is different, thereby weakening the jaggy feeling at the edge of the display.

It can be understood that the variation of the thickness of the cover plate 20 herein from the first light transmission region 3 toward the first sub-region 201 of the second light transmission region 2 and then toward the second sub-region 202 of the second light transmission region 2 is a stepped hash variation. Of course, the variation of the thickness of the cover plate 20 from the first light transmission region 3 toward the first sub-region 201 of the second light transmission region 2, and then toward the second sub-region 202 of the second light transmission region 2 can also be a linear variation. For example, the thickness of the first light transmission region 3 of the cover plate 20 is 0.1 mm, and the thickness of an end of the second sub-region 202 of the second light transmission region 2 away from the first light transmission region 3 is 0.2 mm. The thickness of the cover plate 20 varies linearly from 0.1 mm at the boundary of the second light transmission region 2 and the first light transmission region 3 to 0.2 mm, and the further away from the boundary, the greater the thickness of the cover plate 20 is.

In an exemplary embodiment of the present application, a light transmittance of a material of the second sub-region 202 of the cover plate 20 is lower than a light transmittance of a material of the first sub-region 201.

From the afore-mentioned principle that the light intensity is attenuated according to a different material selection of the cover plate 20, it can be understood that the light intensity or brightness of the outer surface of the cover plate 20 can be changed by changing a material composition of the different regions of the cover plate 20. For example, polymethyl methacrylate (i.e., organic glass) can be selected as the material of first light transmission region 3. Polycarbonate having a light transmittance lower than that of polymethyl methacrylate can be selected as the material of the first sub-region 201 of the second transmission region 2. Polystyrene having relative lower light transmittance can be selected as the material of the second sub-region 202 of the second light transmission region 2. Therefore, the light intensity or brightness of the first sub-region 201 of the second light transmission region 2 of the cover plate 20 is 60 to 70 percent of the light intensity or brightness of the first light transmission region 3. In this way, the light brightness of the second sub-region 202 of the second transmission region 2 of the cover plate 20 is 40 to 50 of the light brightness of the first light transmission region 3.

From the afore-mentioned principle that the light intensity is attenuated according to the different material selection of the cover plate 20, it can be understood that the light intensity or brightness of the outer surface of the cover plate 20 can be changed by changing the material composition of the different regions of the cover plate 20. For example, polymethyl methacrylate (i.e., organic glass) can be selected as the material of first light transmission region 3. An organic glass doped with scattering particles (e.g., particles of polystyrene material) can be selected as the first sub-region 201 of the second transmission region 2. And a doping concentration of the scattering particles of the second sub-region 202 of the second light transmission region 2 is higher than a doping concentration of the scattering particles of the first sub-region 201 of the second light transmission region 2. Therefore, the light intensity or brightness of the first sub-region 201 of the second light transmission region 2 of the cover plate 20 is 60 to 70 percent of the light intensity or brightness of the first light transmission region 3. In this way, the light brightness of the second sub-region 202 of the second transmission region 2 of the cover plate 20 is 40 to 50 percent of light brightness of the first light transmission region 3. Thus, the jaggy feeling at the edge of the display is weakened.

It can be understood that the variation of the light transmittance of the material of the cover plate 20 from the first light transmission region 3 toward the first sub-region 201 of the second light transmission region 2, and then toward the second sub-region 202 of the second light transmission region 2 herein is a stepped hash variation. Of course, the variation of the light transmittance of the material of the cover plate 20 from the first light transmission region 3 toward the first sub-region 201 of the second light transmission region 2 and then toward the second sub-region 202 of the second light transmission region 2 can be a linear variation.

In an exemplary embodiment of the present application, shapes of the first sub-region 201 and the second sub-region 202 are in a shape that a middle portion thereof is wide and two ends are narrow. That is, widths of the first sub-region and the second sub-region decreases from a center thereof toward two ends.

It can be understood that for a display screen that is generally square, an arc chamfered may be designed at the corners, and the first sub-region 201 and the second sub-region 202 having the shape that the middle portion thereof is wide and two ends are narrow can conform to a chamfered structure, thus making a transition of the chamfer more natural.

In an exemplary embodiment of the present application, the thickness of the first light transmission region is ¼ of a green light wavelength.

It can be understood that a human eye is most sensitive to green light among seven color lights. When the thickness of the cover plate 20 is designed to be ¼ of the green light wavelength, an attenuation of the light on the outer surface of the cover plate 20 can be reduced, so that the light transmittance of the main display region is improved, thereby improving the overall display effect of the display screen.

The present application provides a display device integrated with a display screen. The display screen includes a screen main body 10 having a main display region and a chamfered region adjacent to the main display region; and a cover plate 20 for sealing and protecting the screen main body 10 of the display screen. The cover plate 20 has a first light transmission region 3 and a second light transmission region 2 corresponding to the main display region. The first light transmission region 3 corresponds to the screen main body 10 of the display screen, and the second light transmission region 2 corresponds to the chamfered region of the display screen. A light transmittance of the second light transmission region 2 is lower than a light transmittance of the first light transmission region 3.

The screen main body 10 has a main display region and a chamfered region adjacent to the main display region. Generally, the screen main body 10 has an effective display region defined by the contour line 1. The effective display region includes the main display region and the chamfered region adjacent to the main display region, which is generally located at a corner of the main display region 10, and is designed based on the user's needs.

The cover plate 20 is used to seal and protect the screen main body 10. The cover plate 20 has a first light transmission region 3 corresponding to the display region and a second light transmission region 2 corresponding to the chamfered region. The light transmittance of the second light transmission region 2 is lower than the light transmittance of the first light transmission region 3.

According to the display device, the cover plate 20 of the display screen has different light transmittances in different regions, so that when the display screen emits light, and after the light passes through the cover plate 20, light energy of the chamfered region is lower than light energy of the main display region, and the light at the chamfered region is dark. In this way, the jaggy feeling at the chamfered region is weakened.

Of course, it can be understood that the display device herein includes a processor and a storage in a specific application. The processor herein is generally understood as a CPU, that is, an image processing unit for rendering colors. Driving signals of respective pixel units and sub-pixels are provided by the processor.

The storage can include a non-permanent storage, a random access memory (RAM), and/or a non-transitory memory, such as read only memory (ROM) or flash memory (FLASH RAM), in a computer readable medium. Memory is an example of a storage medium.

The storage medium includes permanent and non-permanent, removable and non-removable medium, and information storage can be implemented by any method or technology. Information can be computer readable instructions, data structures, modules of programs, or other data.

The present application provides a cover plate 20 for sealing and protecting a screen main body 10 of a display screen. The cover plate 20 has a first light transmission region 3 corresponding to a main display region of the display screen and a second light transmission region 2 corresponding to a chamfered region of the display screen. A transmittance of the second light transmission region 2 is lower than a light transmittance of the first light transmission region 3.

The technical features of the forgoing exemplary embodiments may be arbitrarily combined. For the sake of brevity of the description, all possible combinations of the technical features in the above exemplary embodiments are not described. However, as long as there is no contradiction between the combinations of these technical features, it should be considered as the scope of the specification.

The invention claimed is:

1. A display screen, comprising:
a screen main body including a main display region and a chamfered region positioned adjacent to the main display region; and
a cover plate sealing the screen main body,
wherein the cover plate includes a first light transmission region corresponding to the main display region and a second light transmission region corresponding to the chamfered region, and
a light transmittance of the second light transmission region is lower than a light transmittance of the first light transmission region;
wherein the cover plate is doped with scattering particles, and a doping concentration of scattering particles in a material of the second light transmission region is higher than a doping concentration of scattering particles in a material of the first light transmission region.

2. The display screen according to claim 1, wherein a light transmittance of a material of the second light transmission region is lower than a light transmittance of a material of the first light transmission region.

3. The display screen according to claim 1, wherein the light transmittance of the second light transmission region gradually decreases away from the first light transmission region.

4. The display screen of claim 3, wherein the second light transmission region comprises at least a first sub-region close to the main display region and a second sub-region separated from the main display region, and
a light transmittance of the second sub-region is lower than a light transmittance of the first sub-region.

5. The display screen according to claim 4, wherein a light transmittance of a material of the second sub-region is lower than a light transmittance of a material of the first sub-region.

6. The display screen according to claim 4, wherein the second light transmission region is doped with scattering particles, and a doping concentration of scattering particles in a material of the second sub-region is higher than a doping concentration of scattering particles in a material of the first sub-region.

7. The display screen according to claim 4, wherein widths of the first sub-region and the second sub-region decrease from a center thereof toward two ends thereof.

8. The display screen according to claim 1, wherein a thickness of the first light transmission region is ¼ of any of a range of green light wavelengths.

9. A display screen, comprising:
a screen main body having a main display region and a chamfered region positioned adjacent to the main display region; and
a cover plate sealing the screen main body,
the cover plate having a first light transmission region corresponding to the main display region and a second light transmission region corresponding to the chamfered region, and
a light transmittance of the second light transmission region being lower than a light transmittance of the first light transmission region;
wherein the light transmittance of the second light transmission region gradually decreases away from the first light transmission region;
the second light transmission region comprises at least a first sub-region close to the main display region and a second sub-region separated from the main display region, and
a light transmittance of the second sub-region is lower than a light transmittance of the first sub-region;
the second light transmission region is doped with scattering particles, and a doping concentration of scattering particles in a material of the second sub-region is higher than a doping concentration of scattering particles in a material of the first sub-region.

10. The display screen according to claim 9, wherein:
the cover plate is doped with scattering particles, and a doping concentration of scattering particles in a material of the second light transmission region is higher than a doping concentration of scattering particles in a material of the first light transmission region.

11. The display screen according to claim 9, wherein:
widths of the first sub-region and the second sub-region decrease from a center thereof toward two ends thereof.

12. A display screen, comprising: a screen main body and a cover plate for sealing the screen main body, the screen main body having a main display region and a chamfered region adjacent to the main display region;
wherein the cover plate comprises a first light transmission region corresponding to the main display region and a second light transmission region corresponding to the chamfer region, and a light transmittance of the second light transmission region is lower than a light transmittance of the first light transmission region;
wherein the light transmittance of the second light transmission region gradually decreases away from the first light transmission region;
the second light transmission region comprises at least a first sub-region close to the main display region and a second sub-region separated from the main display region, and
a light transmittance of the second sub-region is lower than a light transmittance of the first sub-region;
widths of the first sub-region and the second sub-region decrease from a center thereof toward two ends thereof.

13. The display screen according to claim 12, wherein:
the cover plate is doped with scattering particles, and a doping concentration of scattering particles in a material of the second light transmission region is higher than a doping concentration of scattering particles in a material of the first light transmission region.

14. The display screen according to claim 12, wherein:
the second light transmission region is doped with scattering particles, and a doping concentration of scattering particles in a material of the second sub-region is higher than a doping concentration of scattering particles in a material of the first sub-region.

* * * * *